(12) United States Patent
Holtz et al.

(10) Patent No.: US 11,959,937 B2
(45) Date of Patent: Apr. 16, 2024

(54) TRIAXIAL POWER AND CONTROL SYSTEMS AND METHODS

(71) Applicant: Keithley Instruments, LLC, Solon, OH (US)

(72) Inventors: Matthew Alan Holtz, Solon, OH (US); Martin J. Rice, Sagamore Hills, OH (US); Wayne C. Goeke, Hudson, OH (US)

(73) Assignee: Keithley Instruments, LLC

( * ) Notice: Subject to any disclaimer, the term of this patent is extended or adjusted under 35 U.S.C. 154(b) by 691 days.

(21) Appl. No.: 17/112,871

(22) Filed: Dec. 4, 2020

(65) Prior Publication Data

US 2021/0172977 A1 Jun. 10, 2021

Related U.S. Application Data

(60) Provisional application No. 62/945,035, filed on Dec. 6, 2019.

(51) Int. Cl.
| | |
|---|---|
| *G01R 1/04* | (2006.01) |
| *H01B 9/00* | (2006.01) |
| *H01B 9/04* | (2006.01) |
| *H03H 7/46* | (2006.01) |

(52) U.S. Cl.
CPC .......... *G01R 1/0416* (2013.01); *H01B 9/003* (2013.01); *H01B 9/006* (2013.01); *H01B 9/04* (2013.01); *H03H 7/46* (2013.01)

(58) Field of Classification Search
CPC ...... G01R 1/0416; H01B 9/003; H01B 9/006; H01B 9/04; H03H 7/46
See application file for complete search history.

(56) References Cited

U.S. PATENT DOCUMENTS

| | | | | |
|---|---|---|---|---|
| 7,068,061 | B2 * | 6/2006 | Tanida | G01R 31/2844 |
| | | | | 324/762.01 |
| 2006/0001470 | A1 * | 1/2006 | Owen | G11C 7/062 |
| | | | | 327/333 |
| 2015/0241472 | A1 * | 8/2015 | Negishi | G01R 31/2889 |
| | | | | 324/750.24 |
| 2016/0084878 | A1 * | 3/2016 | Goeke | G01R 1/0416 |
| | | | | 324/755.02 |
| 2020/0386790 | A1 * | 12/2020 | Sobolewski | G01R 31/2844 |

* cited by examiner

*Primary Examiner* — Manuel L Barbee
(74) *Attorney, Agent, or Firm* — Miller Nash LLP; Andrew J. Harrington

(57) ABSTRACT

A test and measurement device, including a first input structured to receive a first voltage from a first conductor of a first triaxial cable, a second input structured to receive a second voltage from a second conductor of the first triaxial cable or a second triaxial cable, circuitry configured to change modes based on the first voltage and the second voltage; and an output structured to output a signal.

17 Claims, 4 Drawing Sheets

TRIAXIAL POWER AND CONTROL SYSTEMS AND METHODS

PRIORITY

This disclosure claims benefit of U.S. Provisional Application No. 62/945,035, titled "TRIAXIAL POWER AND CONTROL METHOD," filed on Dec. 6, 2019, which is incorporated herein by reference in its entirety.

TECHNICAL FIELD

This disclosure is directed to systems and methods related to test and measurement systems, and in particular, to test and measurement systems that employ triaxial connectors and cables.

BACKGROUND

For a number of reasons, when setting up a test for a device under test (DUT), it can often be required or beneficial to place a remote device between the test and measurement instrument and the device under test. Such remote modules may include, for example, preamplifiers for low current measurements, devices to modify or protect the test and measurement instrument behavior, remote bias tees (RBTs) to allow for direct current and alternating current testing, and matrices for general switching of instruments to different devices under test.

However, many of these remote devices have no means to control different modes of operation. Further, it is often not practical to add connections, such as wires, to these modules to allow digital communication to change the modes, due to spacing and size concerns, as well as cost to develop the control hardware and drivers.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure are directed to remote modules and circuitry which are connected between a test and measurement instrument and a device under test, and that are capable of changing modes based on an output from the test and measurement instrument.

Figure 1:
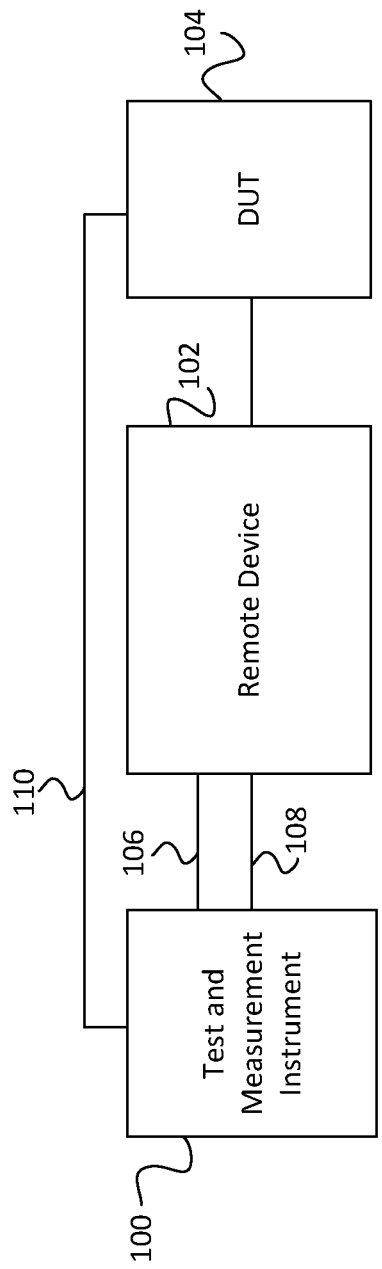
FIG. 1 is a block diagram of a test and measurement system including a remote device.

FIG. 1 illustrates a block diagram of an example test system according to embodiments of the disclosure. A test and measurement instrument 100, such as a source measure unit (SMU), can connect to a device under test 104 through a remote device 102. The test and measurement instrument 100 may also directly connect to the device under test 104.

The test and measurement instrument 100 connects to the remote device 102 and/or the device under test 104 through one or more triaxial cables. A triaxial cable generally includes a center conductor, often known as the force. The center conductor and an inner insulative layer are surrounded by an intermediary conductor, often known as the guard. The guard and another insulative layer are then surrounded by a third outer conductor or shield, which often serves as a ground. Finally, the outer shield is typically surrounded by an outer insulative protective layer, The remote device 102 receives a voltage across two conductors 106 and 108 of the triaxial cable connected to the test and measurement instrument 100. The test and measurement instrument 100 can connect to the device under test 104 through the third conductor 110 of a triaxial cable or can connect directly to the device under test 104 through another triaxial cable. Through the two conductors 106 and 108, the test and measurement instrument 100 can instruct the remote device 102 to change modes for testing the device under test 104. The remote device 102 can modify the signal pathway from the test and measurement instrument 100 for an appropriate test of the device under test 104. In some embodiments, the conductor 106 may be a conductor of a first triaxial cable, and the conductor 108 may be a conductor of a second triaxial cable.

Presently, there is a problem in semiconductor parametric test systems, for example, wherein low current direct current, capacitance-voltage (C/V), and pulse measurements must all be switched and connected to a device under test 104 with the same triaxial cabling. The guard of the triaxial cable is needed for direct current testing, but is often undesirable for C/V and pulse testing. The remote device 102 of the disclosure can allow for the remote device 102 to be closer to the device under test 104, while being able to change modes as needed for testing.

Figure 2:
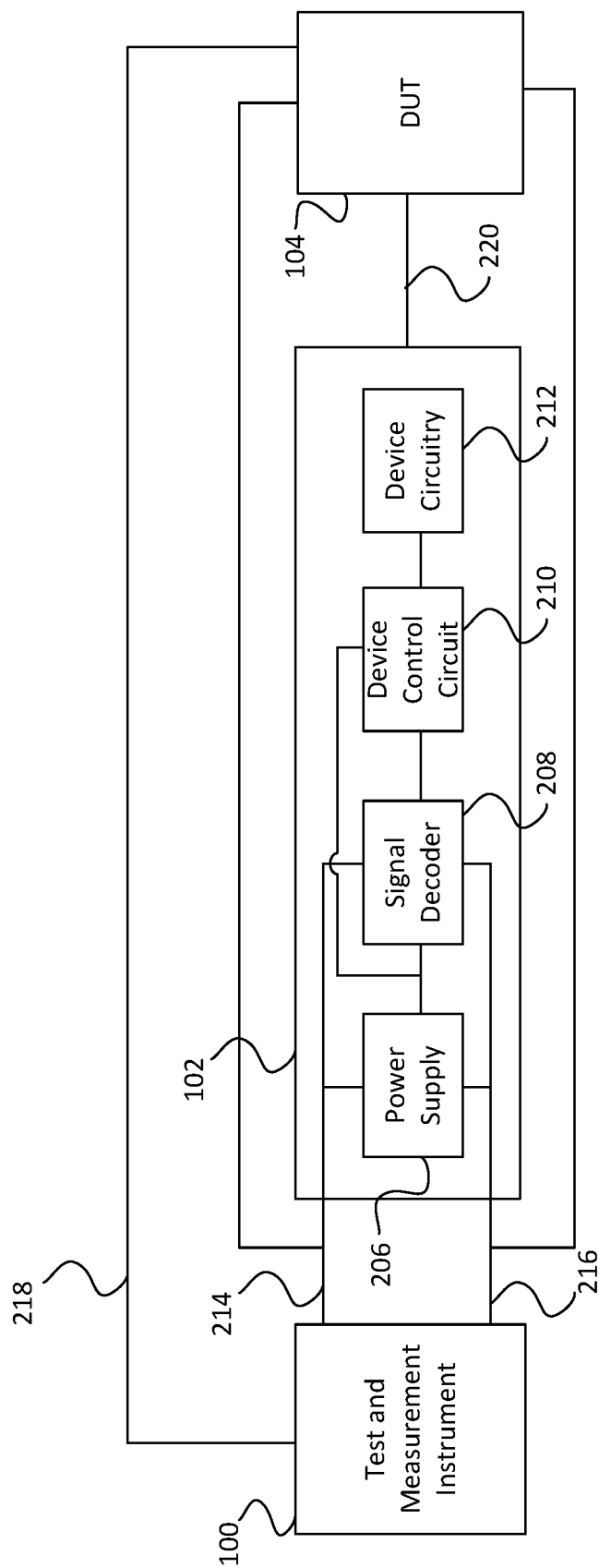
FIG. 2 is a block diagram of a test and measurement system including a remote device according to some embodiments of the disclosure.

FIG. 2 illustrates a remote device according to some embodiments of the disclosure. In this system, the test and measurement instrument 100 can energize a remote device 102 that detects and executes an encoded command to change the mode of the remote device. The system includes a test and measurement instrument 100, a remote device 102, and a device under test 104. The test and measurement instrument 100 can be connected to the remote device 102 through one or more triaxial cables.

The remote device 102 can include a power supply 206, a signal decoder 208, a device control circuit 210 and device or measurement circuitry 212. The remote device is connected to at least two conductors 214 and 216 of a triaxial cable connecting the remote device 102 to the test and measurement instrument 100. The third conductor 218 of the triaxial cable can be directly connected to the device under test 104.

The test and measurement instrument 100 can output a first voltage on a first conductor 214 and a second voltage on a second conductor 216 to change the mode of the remote device 102. In the illustration in FIG. 2, the first conductor 214 is a guard and the second conductor 216 carries a LO signal, while a HI signal is sent to the device under test 202 through the third conductor 218. However, the conductors be configured to can carry a variety of signals, such as HI to guard, guard to LO, HI to LO, or a first guard to a second guard. As long as different voltage signal are sent on each conductor, the conductors 214, 216 can be used to power and communicate with the remote device 102.

The test and measurement instrument 100 can send an initial power signal to the remote device 102 through the first conductor 214 and the second conductor 216, which are received by the power supply 206. The power supply 206 receives the variable voltage from the first conductor 214 and the second conductor 216 and generates a constant voltage supply based on the variable voltage. The constant voltage supply can be used to power the signal decoder 208 and the device control circuit 210.

Once powered, the signal decoder 208 monitors the voltage on the first conductor 214 relative to the second conductor 216 to determine what command the test and measurement instrument 100 is sending to the remote device 102. Using an established communication protocol, the signal decoder 208 can decode a command signal sent from the test and measurement instrument 100 based on the voltages of the first conductor 214 and the second conductor 216.

The device control circuit 210 receives the command from the signal decoder 208 and the device control circuit 210 can take an action to change the operating mode of the remote device 102 in the device circuitry 212. During normal testing, a signal 220 may be output through the remote device 104 to the device under test 104.

In some embodiments, the power supply 206, signal decoder 208, and device control circuit 210 are only active or "on" when voltage is received between the first conductor 214 and the second conductor 216 and otherwise can be powered down or placed in sleep mode.

For example, in some embodiments, the power supply 206 can be a capacitor that is charged from the voltage between the first conductor 214 and the second conductor 216. The capacitor would be large enough to power the signal decoder 208 and the device control circuit 210 to receive and execute the command from the test and measurement instrument 100. When the capacitor has discharged, the power supply 206, signal decoder 208, and device control circuit 210 power off.

As will be understood by one skilled in the art, more complex circuits may be provided to power the signal decoder 208 and the device control circuit 210 down when not in use, such as a switch which disconnects the power supply 206 from the first conductor 214 and the second conductor 216. The switch may be activated based on the voltage between the first conductor 214 and the second conductor 216.

Figure 3:
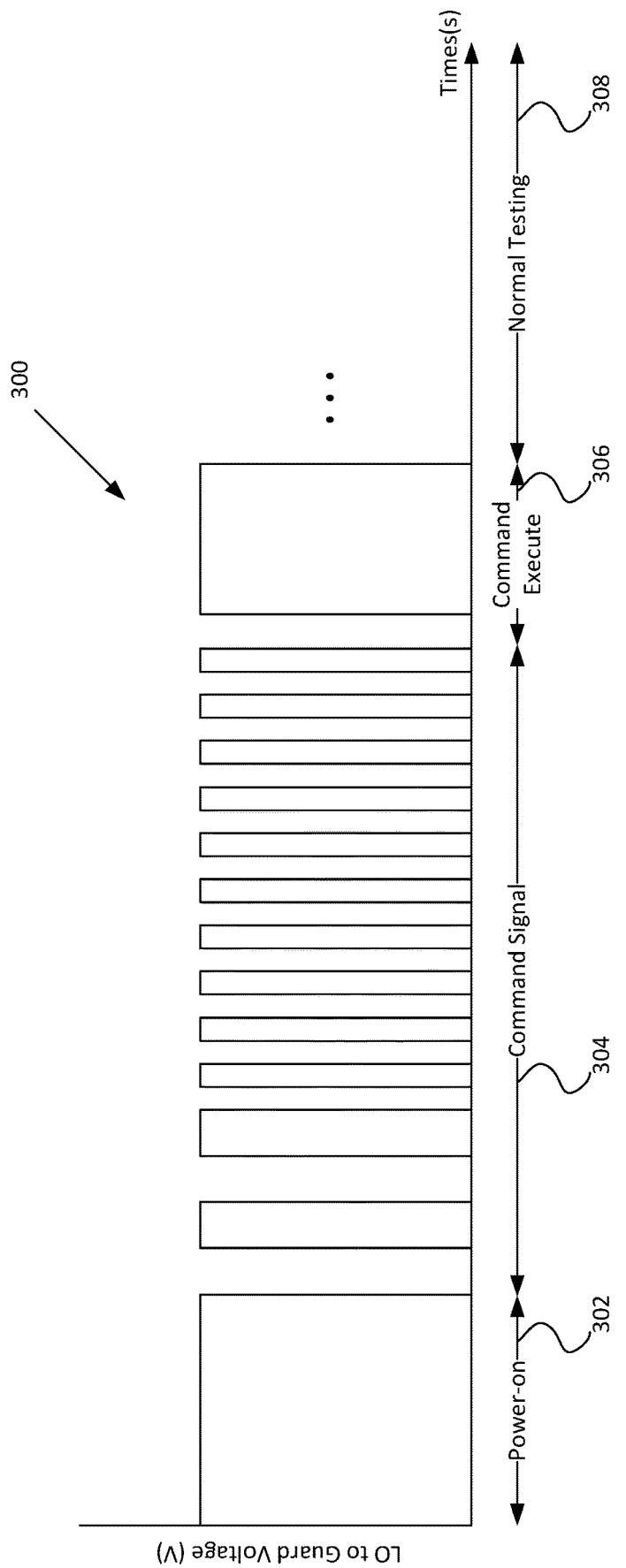
FIG. 3 is an example of a signal that may be received at the remote device of FIG. 2.

FIG. 3 illustrates an example of a signal 300 that may be sent from the test and measurement instrument 100 to the remote device 102 through the first conductor 214 and the second conductor 216. The signal 300 may include a power-on portion 302, a command portion 304, a command execute portion 306, before turning off and normal testing 308 can begin.

The power on portion 302 of the signal 300 is received first to provide a variable voltage to the power supply 206 to generate the constant voltage for the signal decoder 208 and the device control circuit 210. The power on portion 302 of the signal 300 is configured to guarantee that enough charge is delivered to the power supply 206 to power the signal decoder 208 and the device control circuit 210 until the command execute portion 306 of the signal 300 is received and executed.

The command portion 304 is a unique signal that can be decoded by the signal decoder 208. The command portion 304 can be unique so that it is unlikely a test sequence accidentally triggers the device control circuit 210 and causes the remote device 102 to change modes if the power supply 206 is not powered down during the normal testing. In such embodiments, the remote device 102 may include modulating a frequency or pulse amplitude to ensure that the command signal is unique and cannot be triggered by a test sequence.

The signal 300 also includes a command execute portion 306 which informs the remote device 102 that the entirety of the command signal 304 has been received and the device control circuit 210 can change the mode of the remote device 102 based on the decoded command signal from the signal decoder 208, for example, by changing the configuration of device circuitry 212. Once the command has been executed, normal testing of the device under test 104 through the remote device 102 can proceed.

When not powered, the power supply 206, signal decoder 208, and device control circuit 210 float with the guard signal, so that these components do not induce any extra leakage during testing of the device under test.

In some embodiments, the remote device 102 may send a communication signal back to the test and measurement instrument 100, such as to confirm the state or operating mode of the remote device 102. For example, in some embodiments, when the device control circuit 210 has completed executing the command, the device control circuit 210 may initiate a communication back to the test and measurement instrument 100 to confirm that the mode of the remote device 102 has changed. The device control circuit 210 may also confirm which mode the remote device 102 changed to in some embodiments, rather than just confirming the change occurred, so that the test and measurement instrument 100 can confirm that the correct signal was received and decoded by the remote device 102.

The remote device 102 may send the communication signal back to the test and measurement instrument 100 through a separate connection, or may use the first and second conductors 114 and 116. In some embodiments, a third conductor of the triaxial cable may be used to send the signal back to the test and measurement instrument 100. In other embodiments, the remote device 102 may include a transmitter or transceiver that can send the communication back to the test and measurement instrument 100.

Figure 4:
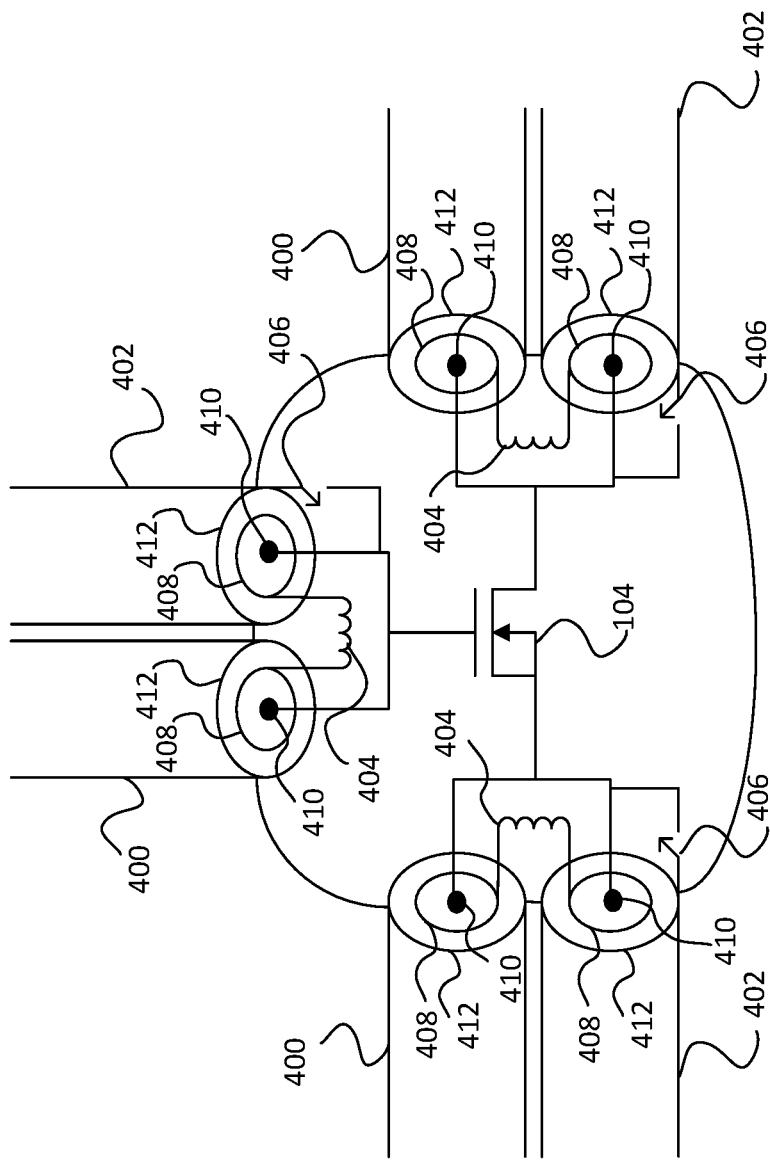
FIG. 4 is another example of a remote device according to other embodiments of the disclosure.

FIG. 4 is another example of a remote device 102 which may be connected between the device under test 104 and the test and measurement instrument 100 (not shown in FIG. 4). FIG. 4 illustrates three Kelvin triaxial connections connected to a three terminal device under test 104. Each Kelvin connection includes two cables 400 and 402, a relay coil 404, and a switch 406.

An intermediary conductor 408 of each cable 400 and 402 is connected to the relay coil 404. The center conductor 410 is connected to one of the terminals of the device under test 104. The switch 406 connects the center conductors 408, the terminal of the device under test 104, and the outer conductor 412 to each other when engaged. The outer conductors 412 of each of the cables 400 and 402 are connected to each other.

In the embodiments of FIG. 4, the test and measurement instrument 100 can instruct the remote device 102 to activate or release the switch 406 based on the type of measurement being performed. For example, the switch 406 may be activated to perform high frequency measurements that require the use of the outer conductor 412.

During operation, the test and measurement instrument 100 may open and close each switch 406 by energizing or de-energizing the associated relay coil 404. To energize or de-energize the relay coil 404, the test and measurement instrument 100 can send a differential voltage across the intermediary conductors 408 of the Kelvin pair of cables 400 and 402. When the switch 406 is open, and relay coil 404 is not activated, the relay coil 404 is at the guard signal, which reduces leakage to the terminal of the device under test 104.

In the embodiment illustrated in FIG. 4, the coil relays 404 can be placed physically close to the device under test 104, which can provide advantages for fast pulse measurements, radio frequency measurements, and high frequency measurements, for example. That is, the remote device as illustrated in FIG. 4 can provide benefits for high frequency measurements, but without giving up accurate measurements for direct current.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 a test and measurement device, comprising a first input structured to receive a first voltage from a first conductor of a first triaxial cable; a second input structured to receive a second voltage from a second conductor of the first triaxial cable or a second triaxial cable; circuitry configured to change modes based on the first voltage and the second voltage; and an output structured to output a signal.

Example 2 is the test and measurement device of example 1, further comprising a power supply configured to receive the first voltage and the second voltage and generate a constant voltage supply based on a voltage differential between the first voltage and the second voltage; and a signal decoder configured to receive the constant voltage supply and monitor the first voltage relative to the second voltage to determine a command code for changing modes.

Example 3 is the test and measurement device of example 2, wherein the power supply is a capacitor.

Example 4 is the test and measurement device of example 2 or 3, further comprising device control circuitry configured to receive the command code from the signal decoder and cause measurement circuitry to change modes based on the command code.

Example 5 is the test and measurement device of example 4, wherein the first conductor is configured to conduct a low signal of the first triaxial cable and the second conductor is a guard of the first triaxial cable.

Example 6 is the test and measurement device of any one of examples 1-5, wherein first voltage and the second voltage are received from a test and measurement instrument.

Example 7 is the test and measurement device of example 1, wherein the second voltage is received from the second conductor of the second cable, the output includes a third conductor of the first triaxial cable and a fourth conductor of the second triaxial cable that are coupled to the device under test, and the circuitry further includes a relay coil connected to the first input and the second input, the relay coil structured to activate based on a voltage differential between the first voltage and the second voltage, and a switch connected to a fifth conductor of the first triaxial cable, wherein the switch changes states when the relay coil is activated.

Example 8 is the test and measurement device of any one of examples 1-7, wherein the output is a first output coupled to a device under test, and the device further comprises a second output configured to send information to a test and measurement instrument.

Example 9 is a system for measuring a device under test, comprising a test and measurement instrument coupled to at least one triaxial cable, the test and measurement instrument configured to output a first voltage on a first conductor of the at least one triaxial cable and to output a second voltage on a second conductor of the at least one triaxial cable; and a module coupled to the test and measurement instrument by the at least one triaxial cable, the module configured to change a mode based on the first voltage and the second voltage.

Example 10 is the system of example 9, wherein the module further includes a power supply configured to receive the first voltage and the second voltage and generate a constant voltage supply based on a voltage differential between the first voltage and the second voltage; and a signal decoder configured to receive the constant voltage supply and monitor the first voltage relative to the second voltage to determine a command code for changing modes.

Example 11 is the system of example 10, wherein the power supply is a capacitor.

Example 12 is the system of either one of examples 10 or 11, wherein the module further includes mode control circuitry configured to receive the command code from the signal decoder and cause a measurement circuit to change modes based on the command code.

Example 13 is the system of any one of examples 9-12, wherein the first conductor is configured to conduct a low signal of a first triaxial cable and the second conductor is a guard of the first triaxial cable.

Example 14 is the system of any one of examples 9, wherein the first conductor is a conductor of a first triaxial cable and the second conductor is a conductor of a second triaxial cable.

Example 15 is the system of example 14, wherein the module includes a relay coil connected to the first input and the second input, the relay coil structured to activate based on a voltage differential between the first voltage and the second voltage, and a switch connected to a third conductor of the first triaxial cable, wherein the switch changes states when the relay coil is activated.

Example 16 is the system of any one of examples 9-15, wherein the module is further configured to send a communication signal to the test and measurement instrument.

Example 17 is a method for operating a remote device, comprising receiving at the remote device a voltage differential between two conductors of one or more triaxial cables from a test and measurement instrument; activating mode circuitry on the remote device to change an operating mode based on the voltage differential; and outputting a signal to a device under test based on the operating mode of the remote device.

Example 18 is the method of example 17, further comprising powering a power supply based on the voltage differential; and decoding a command signal based on the voltage differential to determine the operating mode.

Example 19 is the method of example 17, wherein activating mode circuitry includes activating a relay coil to cause a switch to open or close.

Example 20 is the method of any one of examples 17-19, further comprising transmitting a signal from the remote device to the test and measurement instrument to confirm a mode change.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A test and measurement device, comprising:
   a first input structured to receive a first voltage from a first conductor of a first triaxial cable;
   a second input structured to receive a second voltage from a second conductor of the first triaxial cable or a second triaxial cable;
   circuitry configured to change modes based on the first voltage and the second voltage;
   a power supply configured to receive the first voltage and the second voltage and generate a constant voltage supply based on a voltage differential between the first voltage and the second voltage;
   a signal decoder configured to receive the constant voltage supply and monitor the first voltage relative to the second voltage to determine a command code for changing modes; and
   an output structured to output a signal.

2. The test and measurement device of claim 1, wherein the power supply is a capacitor.

3. The test and measurement device of claim 1, further comprising device control circuitry configured to receive the command code from the signal decoder and cause measurement circuitry to change modes based on the command code.

4. The test and measurement device of claim 3, wherein the first conductor is configured to conduct a low signal of the first triaxial cable and the second conductor is a guard of the first triaxial cable.

5. The test and measurement device of claim 1, wherein the first voltage and the second voltage are received from a test and measurement instrument.

6. A system for measuring a device under test, comprising:
   a test and measurement instrument coupled to at least one triaxial cable, the test and measurement instrument configured to output a first voltage on a first conductor of the at least one triaxial cable and to output a second voltage on a second conductor of the at least one triaxial cable; and
   a module coupled to the test and measurement instrument by the at least one triaxial cable, the module configured to change a mode based on the first voltage and the second voltage;
   a power supply configured to receive the first voltage and the second voltage and generate a constant voltage supply based on a voltage differential between the first voltage and the second voltage; and
   a signal decoder configured to receive the constant voltage supply and monitor the first voltage relative to the second voltage to determine a command code for changing modes.

7. The system of claim 6, wherein the power supply is a capacitor.

8. The system of claim 6, wherein the module further includes mode control circuitry configured to receive the command code from the signal decoder and cause a measurement circuit to change modes based on the command code.

9. A system for measuring a device under test, comprising:
- a test and measurement instrument coupled to at least one triaxial cable, the test and measurement instrument configured to output a first voltage on a first conductor of the at least one triaxial cable and to output a second voltage on a second conductor of the at least one triaxial cable, wherein the first conductor is configured to conduct a low signal of a first triaxial cable and the second conductor is a guard of the first triaxial cable; and
- a module coupled to the test and measurement instrument by the at least one triaxial cable, the module configured to change a mode based on the first voltage and the second voltage.

10. The system of claim 9, wherein the first conductor is a conductor of a first triaxial cable and the second conductor is a conductor of a second triaxial cable.

11. The system of claim 9, wherein the module includes a relay coil connected to the first conductor and the second conductor, the relay coil structured to activate based on a voltage differential between the first voltage and the second voltage, and a switch connected to a third conductor of the first triaxial cable, wherein the switch changes states when the relay coil is activated.

12. The system of claim 9, wherein the module is further configured to send a communication signal to the test and measurement instrument.

13. A method for operating a remote device, comprising:
- receiving at the remote device a voltage differential between two conductors of one or more triaxial cables from a test and measurement instrument;
- activating mode circuitry on the remote device to change an operating mode based on the voltage differential;
- powering a power supply based on the voltage differential; and
- decoding a command signal based on the voltage differential to determine the operating mode; and
- outputting a signal to a device under test based on the operating mode of the remote device.

14. The method of claim 13, wherein activating mode circuitry includes activating a relay coil to cause a switch to open or close.

15. The method of claim 13, further comprising transmitting a signal from the remote device to the test and measurement instrument to confirm a mode change.

16. A test and measurement device, comprising:
- a first input structured to receive a first voltage from a first conductor of a first triaxial cable;
- a second input structured to receive a second voltage from a second conductor of the first triaxial cable or a second triaxial cable;
- circuitry configured to change modes based on the first voltage and the second voltage; and
- an output, having:
  - a first output coupled to a device under test and structured to output a signal, and
  - a second output configured to send information to a test and measurement instrument.

17. The test and measurement device of claim 16, wherein:
- the second voltage is received from the second conductor of the second cable,
- the output includes a third conductor of the first triaxial cable and a fourth conductor of the second triaxial cable that are coupled to a device under test, and
- the circuitry further includes:
  - a relay coil connected to the first input and the second input, the relay coil structured to activate based on a voltage differential between the first voltage and the second voltage, and
  - a switch connected to a fifth conductor of the first triaxial cable, wherein the switch changes states when the relay coil is activated.

\* \* \* \* \*